(12) United States Patent
Wu et al.

(10) Patent No.: US 12,507,419 B2
(45) Date of Patent: *Dec. 23, 2025

(54) MEMORY CELL DEVICE WITH THIN-FILM TRANSISTOR SELECTOR AND METHODS FOR FORMING THE SAME

(71) Applicant: Taiwan Semiconductor Manufacturing Company Limited, Hsinchu (TW)

(72) Inventors: Yong-Jie Wu, Hsinchu (TW); Yen-Chung Ho, Hsinchu (TW); Hui-Hsien Wei, Taoyuan (TW); Chia-Jung Yu, Hsinchu (TW); Pin-Cheng Hsu, Zhubei (TW); Mauricio Manfrini, Zhubei (TW); Chung-Te Lin, Tainan (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 341 days.

This patent is subject to a terminal disclaimer.

(21) Appl. No.: 18/109,124

(22) Filed: Feb. 13, 2023

(65) Prior Publication Data

US 2023/0200090 A1 Jun. 22, 2023

Related U.S. Application Data

(63) Continuation of application No. 17/227,541, filed on Apr. 12, 2021, now Pat. No. 11,581,366.

(Continued)

(51) Int. Cl.
*H10B 61/00* (2023.01)
*H01L 21/02* (2006.01)
(Continued)

(52) U.S. Cl.
CPC ....... *H10B 61/22* (2023.02); *H01L 21/02565* (2013.01); *H10D 30/6728* (2025.01);
(Continued)

(58) Field of Classification Search
CPC ........ H01L 21/02565; H01L 25/06557; H10B 53/30; H10B 53/40; H10B 61/00;
(Continued)

(56) References Cited

U.S. PATENT DOCUMENTS

2002/0140016 A1 10/2002 Cha
2013/0056698 A1 3/2013 Satoh et al.
(Continued)

FOREIGN PATENT DOCUMENTS

CN 109904162 A 6/2019
KR 20020076460 A 10/2002
(Continued)

OTHER PUBLICATIONS

Chinese Patent and Trademark Office; CN Application No. 202110692688.4 Office Action dated Sep. 28, 2023; 8 pages.
(Continued)

*Primary Examiner* — Cheung Lee
(74) *Attorney, Agent, or Firm* — The Marbury Law Group, PLLC

(57) ABSTRACT

A memory structure, device, and method of making the same, the memory structure including: a channel comprising a semiconductor material; a source electrode electrically connected to a first end of the channel; a drain electrode electrically connected to an opposing second end of the channel; a high-k dielectric layer surrounding the channel; a gate electrode surrounding the high-k dielectric layer; and a
(Continued)

memory cell electrically connected to the drain electrode and a bit line. The memory cell includes a first electrode that is electrically connected to the drain electrode.

20 Claims, 13 Drawing Sheets

Related U.S. Application Data

(60) Provisional application No. 63/042,024, filed on Jun. 22, 2020.

(51) Int. Cl.
*H10D 30/67* (2025.01)
*H10D 99/00* (2025.01)
*H10N 50/01* (2023.01)
*H10N 50/80* (2023.01)

(52) U.S. Cl.
CPC ..... *H10D 30/6735* (2025.01); *H10D 30/6755* (2025.01); *H10D 30/6757* (2025.01); *H10D 99/00* (2025.01); *H10N 50/01* (2023.02); *H10N 50/80* (2023.02)

(58) Field of Classification Search
CPC ........ H10B 61/22; H10B 63/34; H10B 63/80; H10D 30/43; H10D 30/435; H10D 30/501–509; H10D 30/6704; H10D 30/6728; H10D 30/674; H10D 30/6735; H10D 30/6755; H10D 30/6757; H10D 62/122; H10D 87/00; H10D 99/00; H10N 50/01; H10N 50/10; H10N 50/80; H10N 70/20

See application file for complete search history.

(56) References Cited

U.S. PATENT DOCUMENTS

| | | |
|---|---|---|
| 2016/0300612 A1 | 10/2016 | Manipatruni et al. |
| 2020/0013951 A1 | 1/2020 | Wu |
| 2020/0111908 A1 | 4/2020 | Sills et al. |

FOREIGN PATENT DOCUMENTS

| | | |
|---|---|---|
| KR | 20200036951 A | 4/2020 |
| WO | 2019046374 A1 | 3/2019 |

OTHER PUBLICATIONS

Korean Patent and Trademark Office, Application No. 10 2021 0075665, First Examination Report mailed Oct. 18, 2022, 8 pages.
Taiwan Patent and Trademark Office, Application No. 110121394 Office Action, mailed Aug. 5, 2022 7 pages.
Korean Patent and Trademark Office; KR Application No. 1020210075665; Notice of Allowance dated Aug. 16, 2023; 8 pages.
Korean Patent and Trademark Office; KR Application No. 1020210075665; Request for Submission of an Opinion dated Oct. 18, 2022; 17 pages.

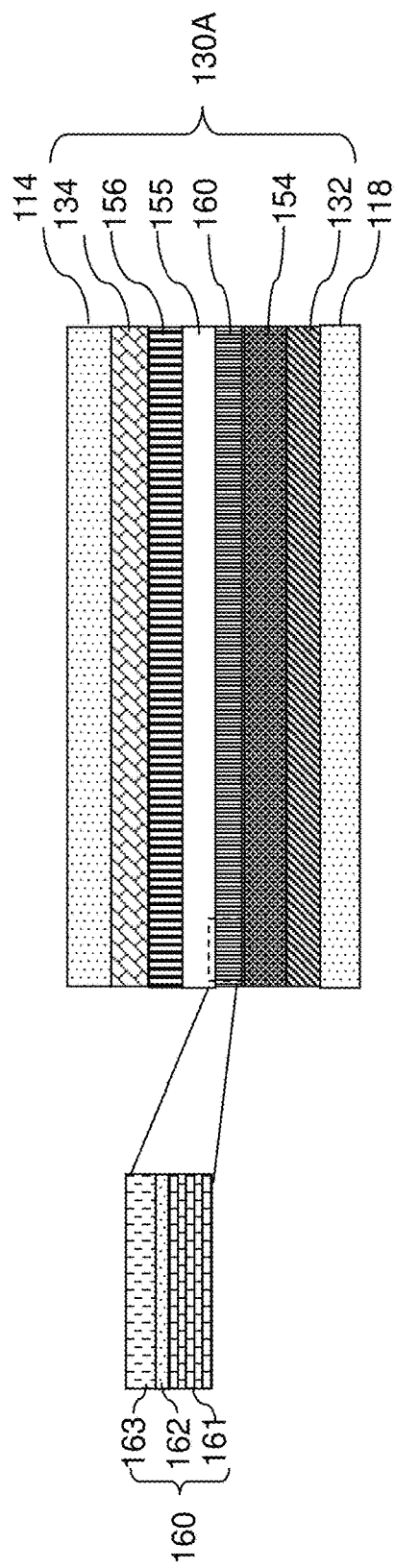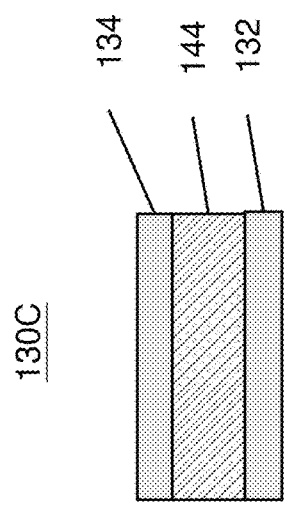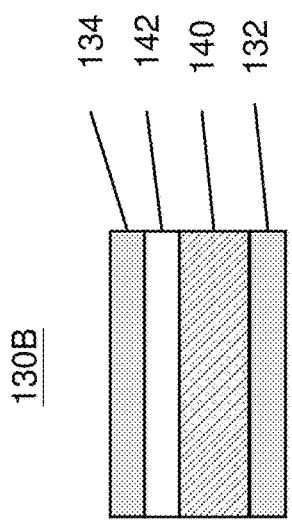
FIG. 3A
FIG. 3B
FIG. 3C

MEMORY CELL DEVICE WITH THIN-FILM TRANSISTOR SELECTOR AND METHODS FOR FORMING THE SAME

RELATED APPLICATIONS

This application is a continuation of U.S. patent application Ser. No. 17/227,541, entitled "Memory Cell Device with Thin-Film Transistor Selector and Methods for Forming the Same" filed Apr. 12, 2021, which claims priority to U.S. Provisional Patent Application No. 63/042,024, entitled "MRAM combined with GAA IGZO TFT" filed on Jun. 22, 2020, the entire contents of both are hereby incorporated by reference for all purposes.

BACKGROUND

In the semiconductor industry, there is constant desire to increase the areal density of integrated circuits. To do so, individual transistors have become increasingly smaller. However, the rate at which individual transistors may be made smaller is slowing. Moving peripheral transistors from the front-end-of-line (FEOL) to the back-end-of Line (BEOL) of fabrication may be advantageous because functionality may be added at the BEOL while valuable chip area may be made available in the FEOL. Thin film transistors (TFT) made of oxide semiconductors are an attractive option for BEOL integration since TFTs may be processed at low temperatures and thus, will not damage previously fabricated devices.

Various memory cell elements (e.g., magneto-resistive random-access memory (MRAM), resistive random-access memory (RRAM or ReRAM)) may utilize a transistor to select or energize the memory cell. However, CMOS transistors used as select transistor may limit the device density of memory cell elements as the size of CMOS transistors may be limiting.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C are each vertical cross-sectional views of exemplary memory cells, according to various embodiments of the present disclosure.

DETAILED DESCRIPTION

Figure 1A:
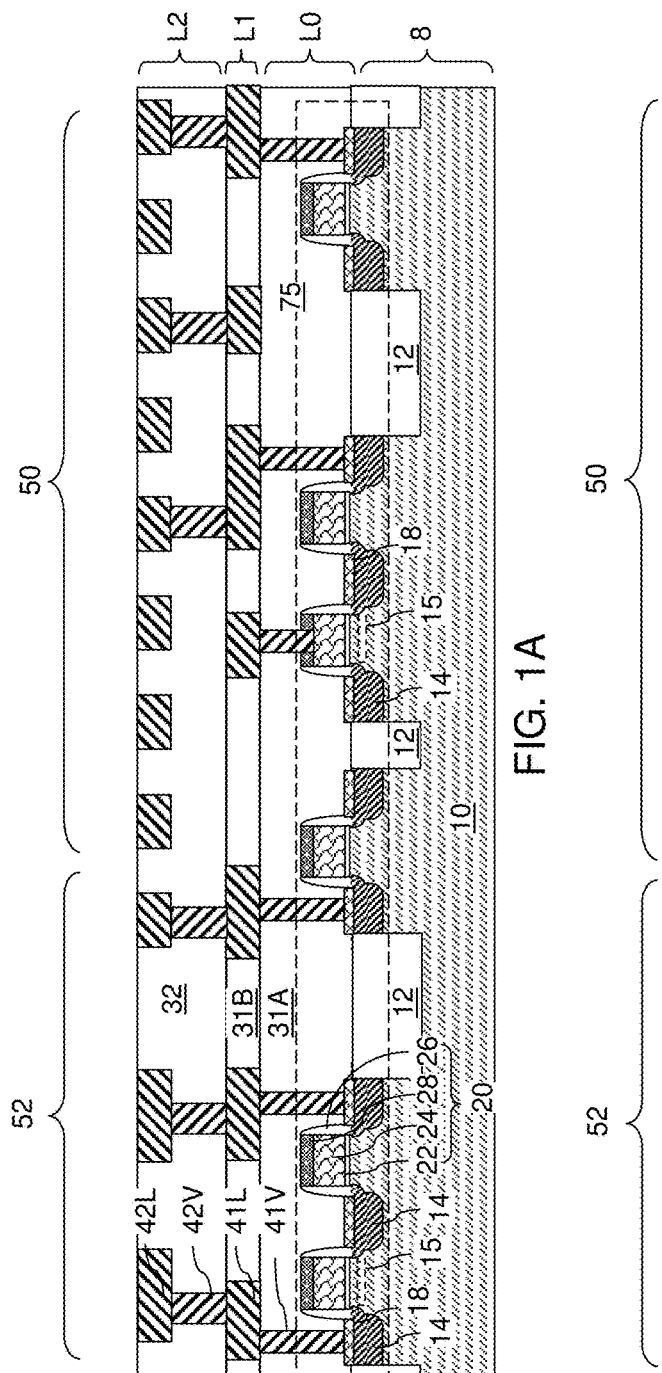
FIG. 1A is a vertical cross-sectional view of a first exemplary structure prior to formation of an array of TFTs according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range. As used herein, the terms "substantially" and "about" refer to a variation of +/−5%.

The present disclosure is directed to semiconductor devices, and specifically to a surrounding gate thin film transistor (TFT), which may also be referred to herein as a gate-all-around (GAA) transistor, that may operate in conjunction with a memory cell device to operate as a memory cell selector device. Various embodiments of the present disclosure may be direct to GAA Indium-Gallium-Zinc-Oxide (IGZO) TFT devices and methods of forming same.

Memory devices include a grid of independently functioning memory cells formed on a substrate. Memory devices may include volatile memory cells or nonvolatile (NV) memory cells. Emerging memory technologies seek to store more data at less cost than the expensive-to-build silicon chips used by popular consumer electronics. Such emerging memory devices may be used to replace existing memory technologies such as flash memory in near future. While existing resistive random-access memories have generally been adequate for their intended purposes, as device scaling-down continues, they have not been entirely satisfactory in all respects. Emerging nonvolatile memory technologies may include resistive random-access memory (RRAM or ReRAM), magneto-resistive random-access memory (MRAM), ferroelectric random-access memory (FeRAM), and phase-change memory (PCM), for example.

RRAM is a type of NV RAM that works by changing the resistance across a dielectric solid-state material, often referred to as a memristor. MRAM is a type of NV RAM that stores data in magnetic domains. Unlike conventional RAM chip technologies, data in MRAM is not stored as electric charge or current flows, but by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. If the insulating layer is thin enough (typically a few nanometres), electrons can tunnel from one ferromagnet into the other. This configuration is known as a magnetic tunnel junction (MTJ) and is the simplest structure for an MRAM bit. Ferroelectric RAM (FeRAM, F-RAM or FRAM) is a random-access memory similar in construction to dynamic RAM (DRAM) but uses a ferroelectric material layer instead of a dielectric material layer to achieve non-volatility. Phase-change memory (also known as PCM, PCME, PRAM, PCRAM, OUM (ovonic unified memory) and C-RAM or CRAM (chalcogenide RAM) is a type of NV RAM. PRAMs exploit the unique behavior of chalcogenide glass. In the older generation of PCM, heat produced by the passage of an electric current through a heating element generally made of titanium nitride (TiN) was used to either quickly heat and quench the glass, making it amorphous, or to hold it in its crystallization temperature range for some time, thereby switching it to a crystalline state. PCM also has the ability to achieve a number of distinct intermediary states, thereby having the ability to hold multiple bits in a single cell. In each of these memory technologies a selecting transistor may be required to energize and select a particular memory cell to perform a read or write operation.

In some memory devices, CMOS transistors may be used as the selecting transistor. However, size limitation of the CMOS transistor technology may be the limiting factor in improving the size and memory cell density of memory devices. The various embodiments described herein improve the size and memory cell density by using surrounding gate TFT as the selecting transistor.

Referring to FIG. 1A, a first exemplary structure according to an embodiment of the present disclosure is illustrated prior to formation of an array of memory structures, according to various embodiments of the present disclosure. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 50 in which at least one array of non-volatile memory cells may be subsequently formed. For example, the at least one array of non-volatile memory cells may include resistive random-access memory (RRAM or ReRAM), magnetic/magneto-resistive random-access memory (MRAM), ferroelectric random-access memory (FeRAM), and phase-change memory (PCM) devices. The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Semiconductor devices such as field effect transistors (FETs) may be formed on, and/or in, the semiconductor material layer 10 during a FEOL operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of TFTs to be subsequently formed.

Various interconnect-level structures may be subsequently formed, which are formed prior to formation of an array of fin back gate field effect transistors and are herein referred to as lower interconnect-level structures (L0, L1, L2). In case a two-dimensional array of TFTs is to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric layer 31B and first metal lines 41L formed within the first interconnect level dielectric layer 31B. The first interconnect level dielectric layer 31B is also referred to as a first line-level dielectric layer. The first metal lines 41L may contact a respective one of the contact via structures 41V. The second interconnect-level structure L2 includes a second interconnect level dielectric layer 32, which may include a stack of a first via-level dielectric material layer and a second line-level dielectric material layer or a line-and-via-level dielectric material layer. The second interconnect level dielectric layer 32 may have formed there within second interconnect-level metal interconnect structures (42V, 42L), which includes first metal via structures 42V and second metal lines 42L. Top surfaces of the second metal lines 42L may be coplanar with the top surface of the second interconnect level dielectric layer 32.

Figure 1B:
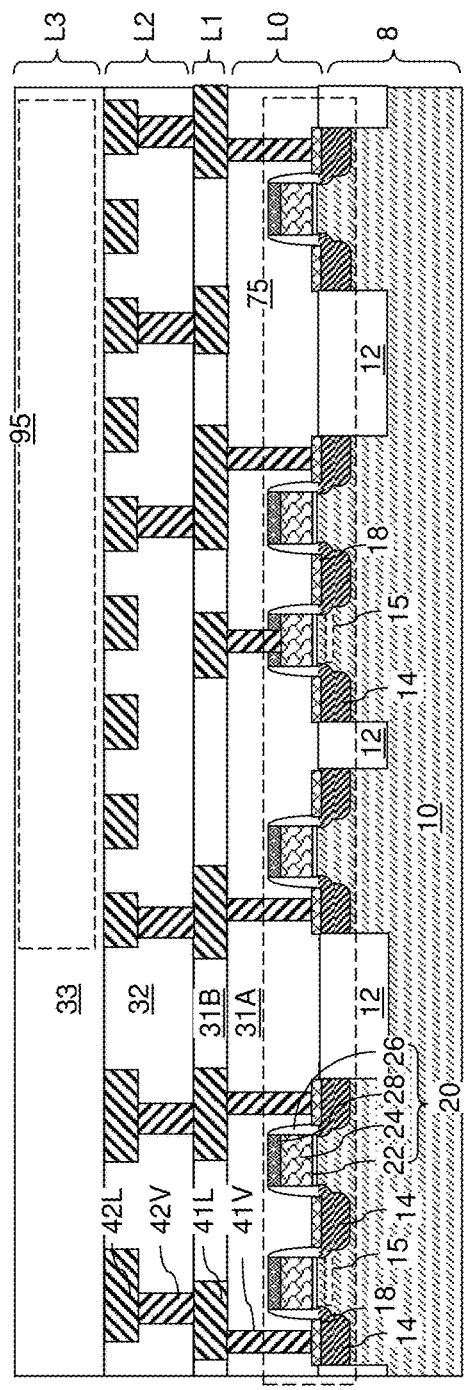
FIG. 1B is a vertical cross-sectional view of the first exemplary structure during formation of the array of fin back gate field effect transistors according to an embodiment of the present disclosure.

Referring to FIG. 1B, an array 95 of non-volatile memory cells and TFT selector devices may be formed in the memory array region 50 over the second interconnect-level structure L2. The details for the structure and the processing steps for the array 95 of non-volatile memory cells and TFT selector devices are subsequently described in detail below. A third interconnect level dielectric layer 33 may be formed during formation of the array 95 of non-volatile memory cells and TFT selector devices. The set of all structures formed at the level of the array 95 of non-volatile memory cells and TFT selector devices transistors is herein referred to as a third interconnect-level structure L3.

Figure 1C:
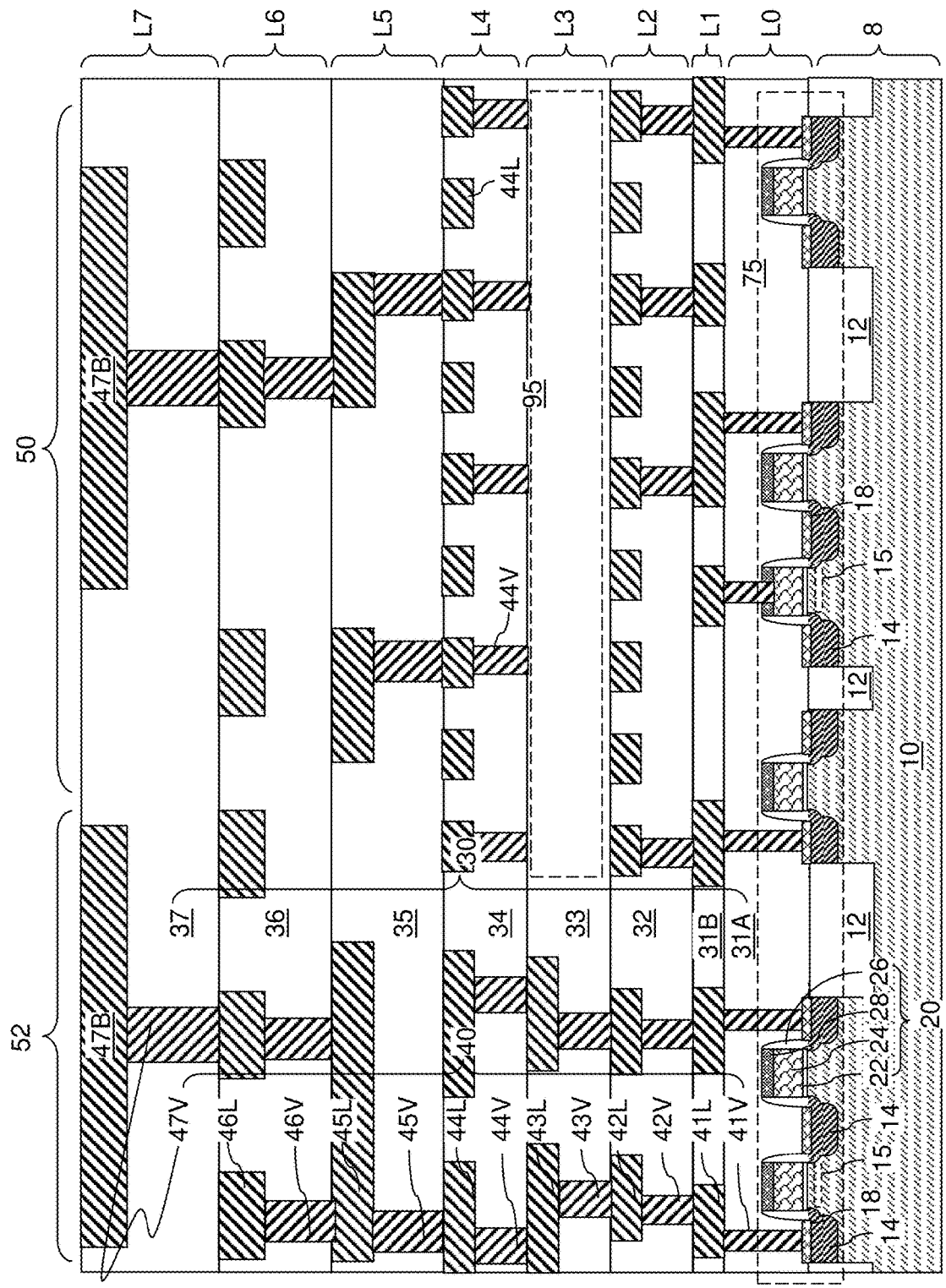
FIG. 1C is a vertical cross-sectional view of the first exemplary structure after formation of upper-level metal interconnect structures according to an embodiment of the present disclosure.

Referring to FIG. 1C, third interconnect-level metal interconnect structures (43V, 43L) may be formed in the third interconnect level dielectric layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect level dielectric layer 34 having formed therein fourth interconnect-level metal interconnect structures (44V, 44L), which may include third metal via structures 44V and fourth metal lines 44L. The fifth interconnect-level structure L5 may include a fifth interconnect level dielectric layer 35 having formed therein fifth interconnect-level metal interconnect structures (45V, 45L), which may include fourth metal via structures 45V and fifth metal lines 45L. The sixth interconnect-level structure L6 may include a sixth interconnect level dielectric layer 36 having formed therein sixth interconnect-level metal interconnect structures (46V, 46L), which may include fifth metal via structures 46V and sixth metal lines 46L. The seventh interconnect-level structure L7 may include a seventh interconnect level dielectric layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each interconnect level dielectric layer may be referred to as an interconnect level dielectric layer (ILD) layer 30. Each interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells and TFT selector devices may be formed as a component of a third interconnect-level structure L3, embodiments are expressly contemplated herein in which the array 95 of non-volatile memory cells and TFT selector devices may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells and TFT selector devices may be provided within multiple interconnect-level structures in the memory array region 50. While the present disclosure is described employing an embodiment in which an array 95 of non-volatile memory cells and TFT selector devices may be formed in a single interconnect-level structure, embodiments are expressly contemplated herein in which an array 95 of non-volatile memory cells and TFT selector devices may be formed over two vertically adjoining interconnect-level structures.

Figure 2B:
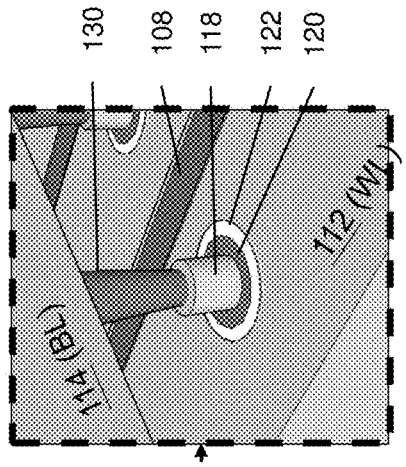
FIG. 2B is an enlarged view of a portion of FIG. 2A including a memory structure 202.
Figure 2A:
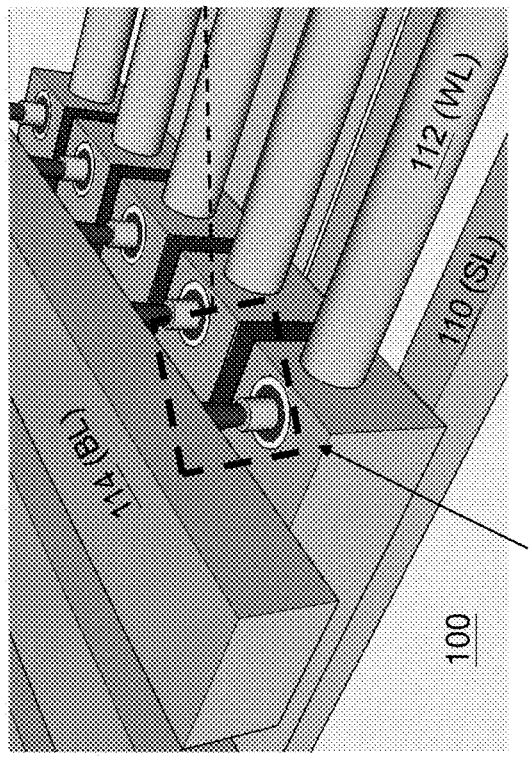
FIG. 2A is a partial perspective view of a memory device 200, according to various embodiments of the present disclosure.
Figure 2C:
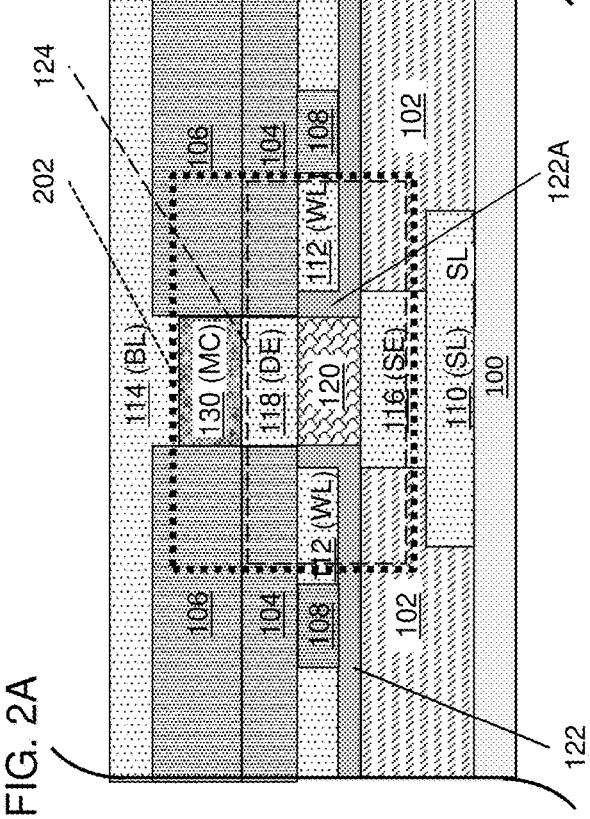
FIG. 2C is a vertical cross-sectional view of the memory structure 202 of FIGS. 2A and 2B.

FIG. 2A is a partial perspective view of a memory device 200, according to various embodiments of the present disclosure, FIG. 2B is an enlarged view of a portion of FIG. 2A including a memory structure 202, and FIG. 2C is a cross-sectional view of taken through a memory structure 202 of FIGS. 2A and 2B.

Referring to FIGS. 2A-2C, the memory device 200 may include an array of memory structures 202 disposed on a substrate 100. The substrate 100 may be a semiconductor wafer, or may be an under-layer such as a metal layer. For example, the substrate 100 may include silicon. The substrate 100 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate 100 may include a non-semiconductor material such as a glass substrate for thin-film-transistor liquid crystal display (TFT-LCD) devices, or fused quartz or calcium fluoride for a photomask (mask). The substrate 100 may include various doped regions and/or dielectric features for various microelectronic components, such as a complementary metal-oxide-semiconductor field-effect transistor (CMOSFET), imaging sensor, memory cell, and/or capacitive element.

The memory device 200 may also include source lines 110, word lines 112 (e.g., gate lines), and bit lines 114 (e.g., top electrodes). The source lines 110 may extend across the substrate 100 in a first direction. The word lines 112 may be disposed over the source lines 110 and may also extend in the first direction. The source lines 110 and word lines 112 may be respectively overlapped.

The bit lines 114 may be disposed over the word lines 112. The bit lines 114 may extend in a second direction, so as to cross the word lines 112 and source lines 110. In some embodiments, the second direction may be substantially perpendicular to the first direction.

The source lines 110, word lines 112, and bit lines 114 may be formed of any suitable electrically conductive electrode material, such as, copper, aluminum, zirconium, titanium, tungsten, tantalum, ruthenium, palladium, platinum, cobalt, nickel or alloys thereof. Other suitable electrode materials are within the contemplated scope of disclosure. The source lines 110, word lines 112, and bit lines 114 may be formed by depositing a layer of conductive material using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metal organic CVD (MOCVD) process, a plasma enhanced CVD (PECVD) process, a sputtering process, or the like. The deposited layer may then be patterned using any suitable process, such as by utilizing a patterned photoresist and an etching process, such as a wet or dry etching process.

The source lines 110 may be disposed on and/or within a dielectric oxide layer 102 disposed on the substrate 100. The dielectric oxide layer 102 may include a dielectric oxide material, such as silicon oxide ($SiO_2$), and may be formed by a thermal process or any suitable deposition process, as described above.

The word lines 112 may be disposed on the dielectric oxide layer 102, a first dielectric layer 104 may be disposed on the word lines 112, a second dielectric layer 106 may be disposed on the first dielectric layer 104, and the bit lines 114 may be disposed on the second dielectric layer 106. Third dielectric layers 108, which may also be referred to as spacers 108, may be configured to electrically insulate and physically separate adjacent word lines 112. The dielectric layers 104, 106, 108, may be formed by any suitable deposition process, as described above, and may include any suitable dielectric material. Herein, "suitable dielectric materials" may include silicon oxide ($SiO_2$), a suitable high-k dielectric material, or the like A high-k dielectric layer 122 may be disposed between the word line 112 and the dielectric oxide layer 102. The high-k dielectric layer 122 may be formed of any suitable dielectric material having a dielectric constant greater than 3.9. Herein, "suitable high-k dielectric materials" include, but are not limited to, silicon nitride ($SiN_4$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$), tantalum oxide ($Ta_2O_5$), aluminum oxide ($Al_2O_3$), hafnium dioxide-alumina ($HfO_2$—$Al_2O_3$), zirconium oxide ($ZrO_2$). Other suitable high-k dielectric materials are within the contemplated scope of disclosure.

In various embodiments, the high-k dielectric layer 122 may have a thickness $t_{hk}$ in the range of 0.5-5.0 nm, such as 1-4 nm, although greater or lesser thicknesses may be used. In various embodiments, the channel 120 may have a thickness $t_c$ in the range of 1-20 nm, such as 3-15 nm, although greater or lesser thicknesses may be used.

Each memory structure 202 may be disposed between a corresponding bit line 114 and source line 110. In various embodiments, each memory structure 202 may include a surrounding gate thin film transistor (TFT) 124, which may also be referred to herein as a gate-all-around (GAA) transistor 124, and a memory cell 130. The GAA transistor 124 may include a source electrode 116 formed on the source line 110, a channel 120 disposed on the source electrode 116, at least a portion of a word line 112 that operates as a gate electrode for the channel 120, and a drain electrode 118 that electrically connects the channel 120 to the memory cell 130.

The memory structure 202 may also include a surrounding gate insulator (SGI) layer 122A. The SGI layer 122A may be formed by a portion of the high-k dielectric layer 122 that surrounds the channel 120 and electrically insulates the channel 120 and/or source electrode 116 from the word line 112.

The channel 120 may include any suitable semiconductor material. Herein, "suitable semiconductor materials" may include amorphous silicon or a semiconducting oxide, such as InGaZnO (IGZO), InWO, InZnO, InSnO, $GaO_x$, $InO_x$, and the like. Other suitable semiconductor materials to form the channel are within the contemplated scope of disclosure. In some embodiments, the channel 120 may preferably be formed of IGZO. The channel 120 may be in the form of a column, pillar, or wire. In some embodiments, the channel 120 may be in the form of a nanowire. However, the channel 120 is not limited to any particular shape.

The channel 120 may operate to control current flow from the source electrode 116 to the drain electrode 118 and into a first end of the memory cell 130. A second end of the memory cell 130 may be electrically connected to the bit line 114.

In particular, the channel 120 and the SGI layer 122A may be disposed in a through-hole (e.g., via or contact hole) formed in the word line 112, such that the channel 120 may be surrounded by the SGI layer 122A and the word line 112. The word line 112 may operate as a gate electrode for controlling current flow through the channel 120 and to the memory cell 130. Accordingly, the GAA transistor 124 may be configured to control operation of the memory cell 130 (i.e., a selecting transistor).

For example, the channel 120 and the memory cell 130 may be disposed on a line that extends perpendicular to a plane of the substrate 100. The channel 120 and memory cell 130 may be vertically stacked when a long axis of the substrate is substantially horizontal. Thus, a long axis of the channel 120 and memory cell 130 may be perpendicular to the plane of the substrate 100. As such, the memory structure 202 including the GAA transistor 124 has a more compact configuration. For example, conventional memory structures may include transistors disposed below word lines or to the side of memory cells. As such, the memory structure 202 may allow for a higher memory cell density than conventional memory structures.

FIGS. 3A-3B are vertical cross-sectional views of exemplary memory cells 130A, 130B, 130C that may be included as the memory cell 130 of the memory structure 202, according to various embodiments of the present disclosure. Referring to FIG. 3A, the memory cell 130A may be a magnetic tunnel junction (MTJ) memory cell 130. Each MTJ memory cell 130A may include a bottom electrode 132, a magnetic tunnel junction structure (160, 155, 156), and a top electrode 134. The top electrode 134 may be electrically connected to a bit line 114, and the bottom electrode 132 may be electrically connected to a drain electrode 118.

Each magnetic tunnel junction (160, 155, 156) may include a synthetic antiferromagnetic (SAF) structure 160, a nonmagnetic tunnel barrier layer 155, and a free magnetization layer 156. A nonmagnetic metallic buffer layer 154 may be provided between the bottom electrode 132 and the magnetic tunnel junction (160, 155, 156).

The components/layers 132, 154, 160, 155, 156, may be deposited by chemical vapor deposition process, physical vapor deposition process, or combinations thereof. Each component/layer 132, 154, 160, 155, 156, may be deposited as planar blanket material layers having a respective uniform thickness throughout. The nonmagnetic metallic buffer layer 154, the synthetic antiferromagnetic layer 160, the nonmagnetic tunnel barrier layer 155, and the free magnetization layer 156 are collectively referred to as memory material layers. In other words, memory material layers are formed between the bottom electrode 132 and the top electrode 134.

While the present disclosure is described using an embodiment in which the memory material layers include the nonmagnetic metallic buffer layer 154, the synthetic antiferromagnetic layer 160, the nonmagnetic tunnel barrier layer 155, and the free magnetization layer 156, the methods and structures of the present disclosure may be applied to any structure in which the memory material layers include a different layer stack provided between a bottom electrode 132 and a top electrode 134 and include material that may store information in any manner. Modifications of the present disclosure are expressly contemplated herein in which the memory material layers include a phase change memory material, a ferroelectric memory material, or a vacancy-modulated conductive oxide material.

The bottom electrode 132 may include at least one nonmagnetic metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode 132 may include, and/or may consist essentially of, an elemental metal such as W, Cu, Ti, Ta, Ru, Co, Mo, or Pt. The thickness of the bottom electrode 132 may be in a range from 10 nm to 100 nm, although lesser and greater thicknesses may also be used.

The nonmagnetic metallic buffer layer 154 may include a nonmagnetic material that may function as a seed layer. Specifically, the nonmagnetic metallic buffer layer 154 may provide a template crystalline structure that aligns polycrystalline grains of the materials of the SAF layer 160, along directions that maximizes the magnetization of a reference layer within the SAF layer 160. The nonmagnetic metallic buffer layer 154 may include Ti, a CoFeB alloy, a NiFe alloy, ruthenium, or a combination thereof. The thickness of the nonmagnetic metallic buffer layer 154 may be in a range from 3 nm to 30 nm, although lesser and greater thicknesses may also be used.

The SAF layer 160 may include a layer stack of a ferromagnetic hard layer 161, an antiferromagnetic coupling layer 162, and a reference magnetization layer 163. Each of the ferromagnetic hard layer 161 and the reference magnetization layer 163 may have a respective fixed magnetization direction. The antiferromagnetic coupling layer 162 provides antiferromagnetic coupling between the magnetization of the ferromagnetic hard layer 161 and the magnetization of the reference magnetization layer 163, so that the magnetization direction of the ferromagnetic hard layer 161 and the magnetization direction of the reference magnetization layer 163 remain fixed during operation of the memory cell 130A.

The ferromagnetic hard layer 161 may include a hard ferromagnetic material such as PtMn, IrMn, RhMn, FeMn, OsMn, etc. The reference magnetization layer 163 may include a hard ferromagnetic material such as Co, CoFe, CoFeB, CoFeTa, NiFe, CoPt, CoFeNi, etc. Other suitable materials within the contemplated scope of disclosure may also be used. The antiferromagnetic coupling layer 162 may include ruthenium or iridium. The thickness of the antiferromagnetic coupling layer 162 may be selected such that the exchange interaction induced by the antiferromagnetic coupling layer 162 stabilizes the relative magnetization directions of the ferromagnetic hard layer 161 and the reference magnetization layer 163 at opposite directions, i.e., in an antiparallel alignment. In one embodiment, the net magnetization of the SAF layer 160 be produced by matching the magnitude of the magnetization of the ferromagnetic hard layer 161 with the magnitude of the magnetization of the reference magnetization layer 163. The thickness of the SAF layer 160 may be in a range from 5 nm to 30 nm, although lesser and greater thicknesses may also be used.

The nonmagnetic tunnel barrier layer 155 may include a tunneling barrier material, which may be an electrically insulating material having a thickness that allows electron tunneling. For example, the nonmagnetic tunnel barrier layer 155 may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other suitable materials within the contemplated scope of disclosure may also be used. The thickness of the nonmagnetic tunnel barrier layer 155 may be 0.7 nm to 1.3 nm, although lesser and greater thicknesses may also be used.

The free magnetization layer 156 may include a ferromagnetic material having two stable magnetization directions that are parallel or antiparallel to the magnetization direction of the reference magnetization layer 163. The free magnetization layer 156 may include a hard ferromagnetic material such as Co, CoFe, CoFeB, CoFeTa, NiFe, CoPt, CoFeNi, etc. Other suitable materials within the contemplated scope of disclosure may also be used. The thickness of the free magnetization layer 156 may be in a range from 1 nm to 6 nm, although lesser and greater thicknesses may also be used.

The top electrode 134 may include any nonmagnetic material that may be used for the bottom electrode 132. Exemplary metallic materials that may be used for the top electrode 134 include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode 132 may include, and/or may consist essentially of, an elemental metal such as W, Cu, Ti, Ta, Ru, Co, Mo, or Pt. The thickness of the top electrode 134 may be in a range from 10 nm to 100 nm, although lesser and greater thicknesses may also be used.

Referring to FIG. 3B, the memory cell 130B may be a PCM memory cell including a bottom electrode 132, a top electrode 134, a heater 140, and a phase change material layer 142. The phase change material layer 142 may operate as a data storage layer.

The heater 140 may be formed of thin film of TiN, TaN, or TiAlN that has a thickness in a range from about 5 to about 15 nm to provide Joule heating to the phase change material 162. Also, the heater 140 may function as a heat sink during quenching (during abrupt cutoff of the current applied to the heater 140 to 'freeze' the amorphous phase).

In some embodiments, the phase change material layer 142 comprises a binary system material of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; or a quaternary system of Ag—In—Sb—Te, Ge—Sn—Sb—Te, Ge—Sb—Se—Te, Te—Ge—Sb—S, Ge—Sb—Te—O, and Ge—Sb—Te—N. In some embodiments, the phase change material layer 142 comprises a chalcogenide alloy containing one or more elements from Group VI of the periodic table, such as a GST, a Ge—Sb—Te alloy (e.g., $Ge_2Sb_2Te_5$) having a thickness of 5 to 100 nm. The phase change material layer 142 may include other phase change resistive materials, such as metal oxides including tungsten oxide, nickel oxide, copper oxide, etc. The phase transition between the crystalline phase and the amorphous phase of the phase change material is related to the interplay between the long range order and the short range order of the structure of the phase change material. For example, collapse of the long range order generates the amorphous phase. The long range order in the crystalline phase facilitates electrical conduction, while the amorphous phase impedes electrical conduction and results in high electrical resistance. To tune the properties of the phase change material layer 142 for different needs, the phase change material layer 142 may be doped with various elements at different amounts to adjust the proportion of the short range order and the long range order inside the bonding structure of the material. The doped element may be any element used for semiconductor doping through the use of, for example, ion implantation.

Referring to FIG. 3C the memory cell 130C may be a FeRAM memory cell including a bottom electrode 132, a top electrode 134, and a ferroelectric material layer 144, such as lead zirconate titanate (PZT) layer. The ferroelectric material layer 144 may operate as a data storage layer.

Figure 4A:
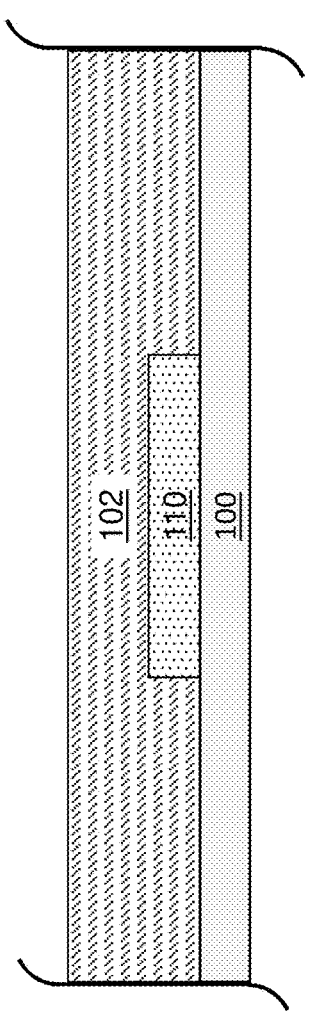
FIGS. 4A-4Q are each vertical cross-sectional views illustrating various steps of a method of forming a memory device, according to various embodiments of the present disclosure.
Figure 4B:
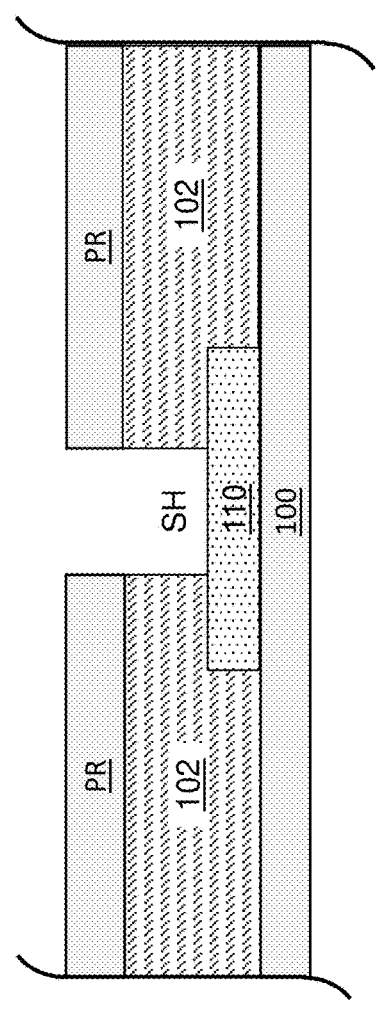
Figure 4C:
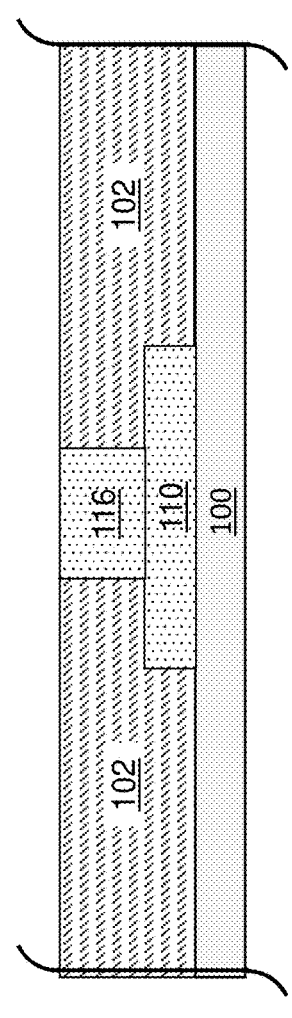
Figure 4D:
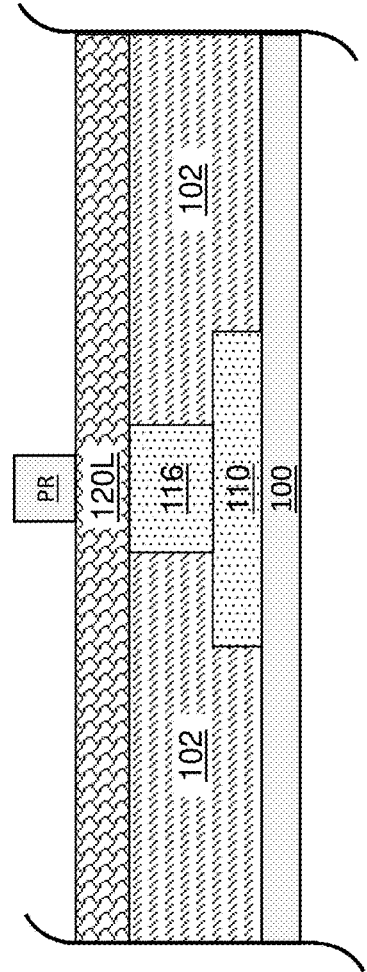
Figure 4E:
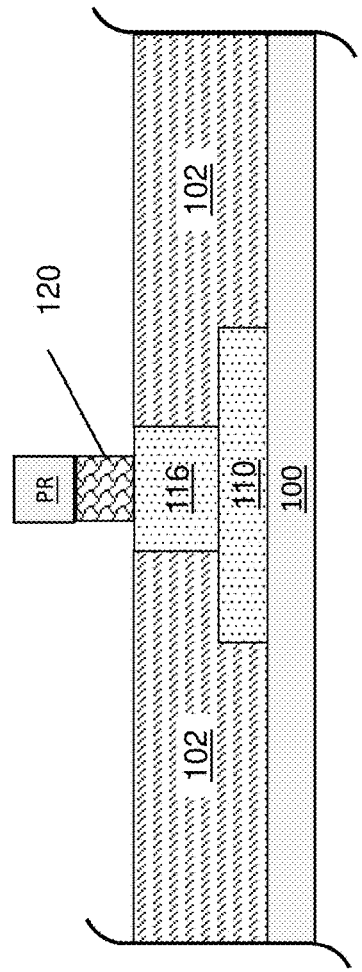
Figure 4F:
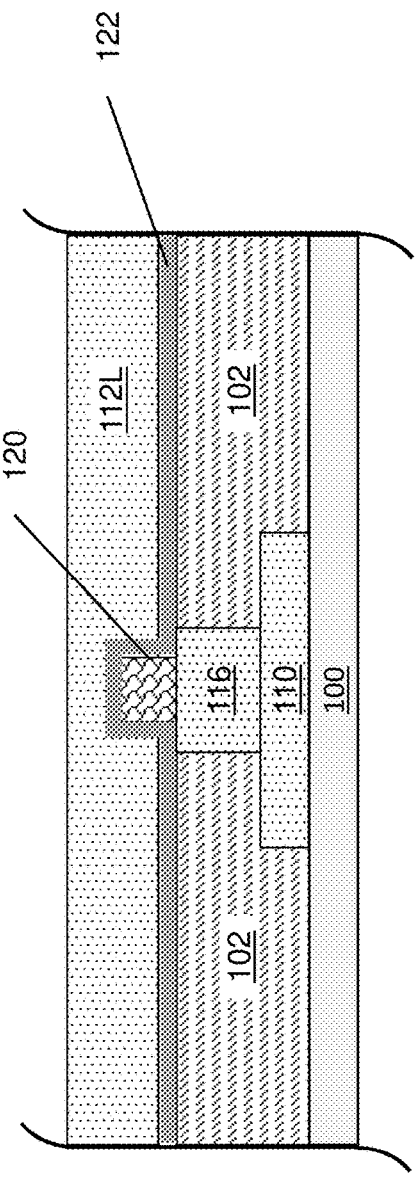
Figure 4G:
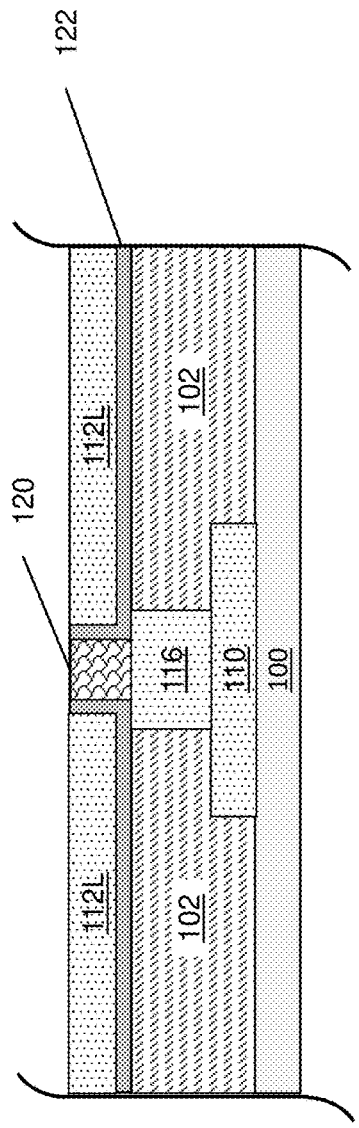
Figure 4H:
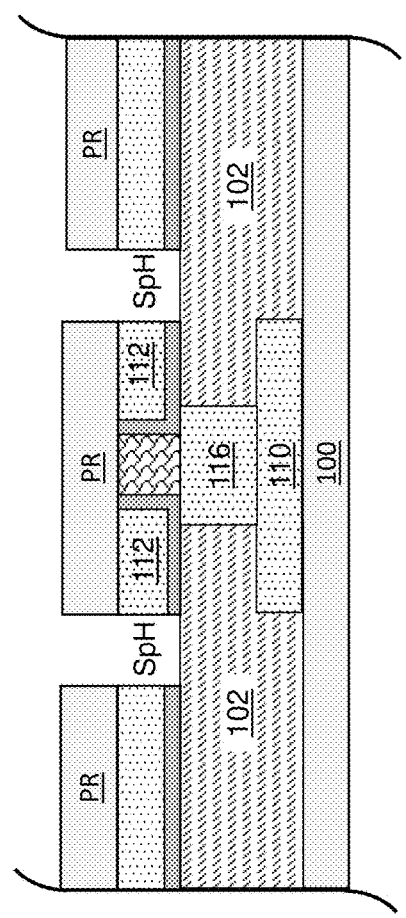
Figure 4I:
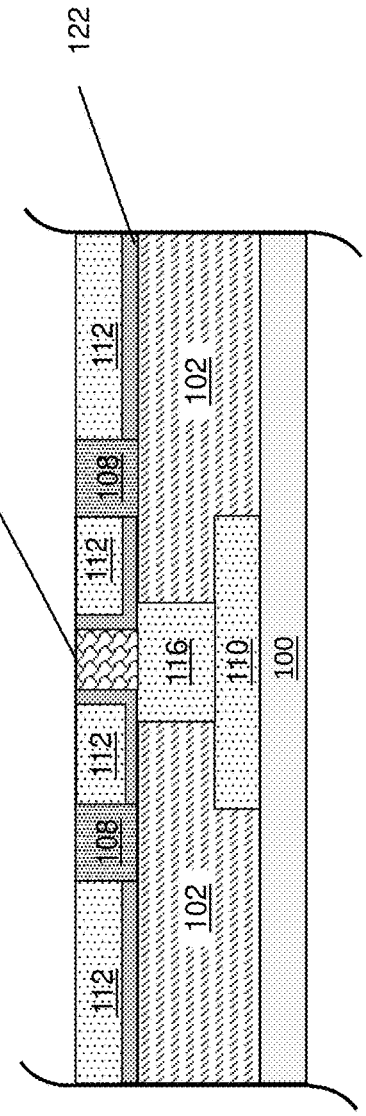
Figures 4J, 4K, 4L:
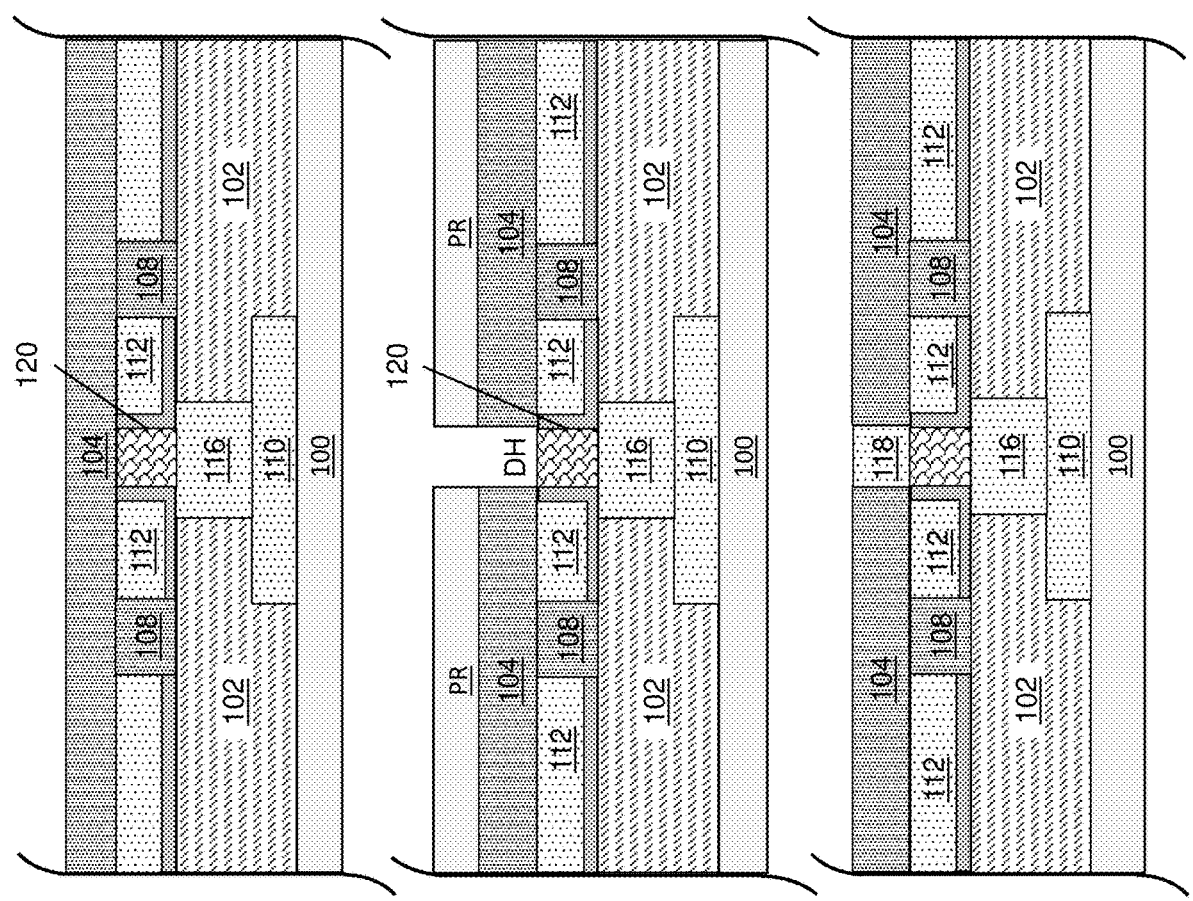
Figure 4M:
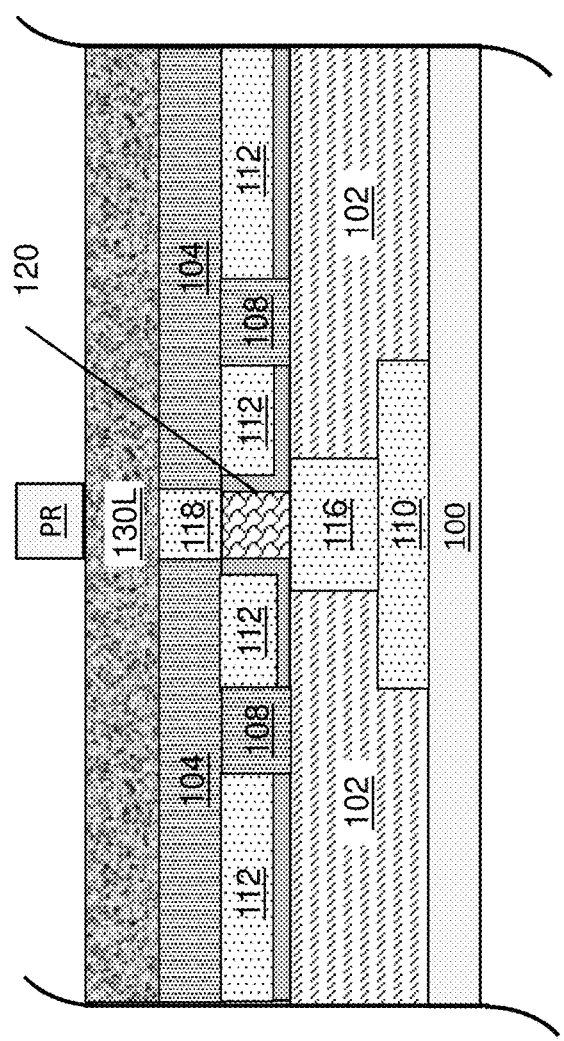
Figure 4N:
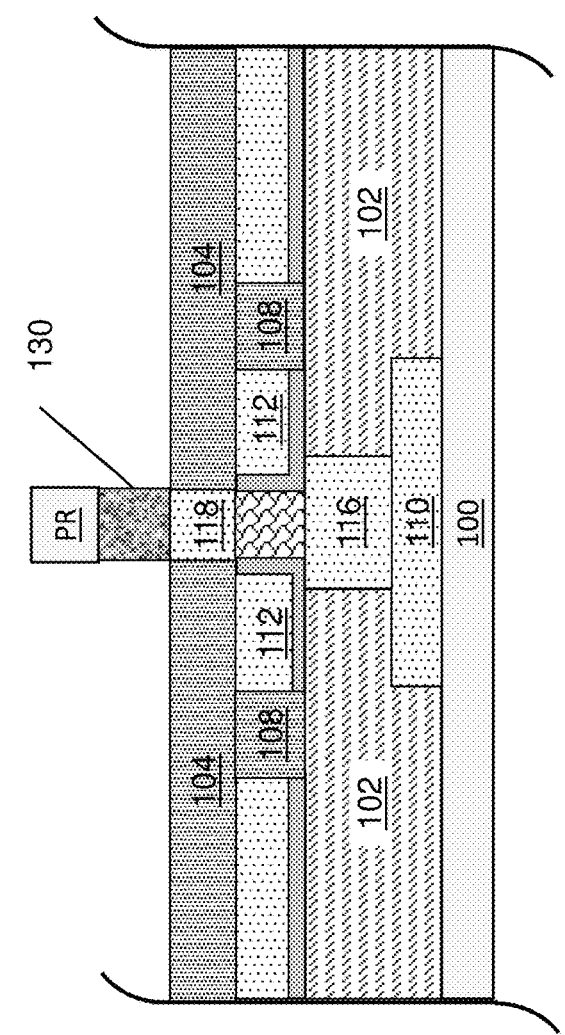
Figure 4O:
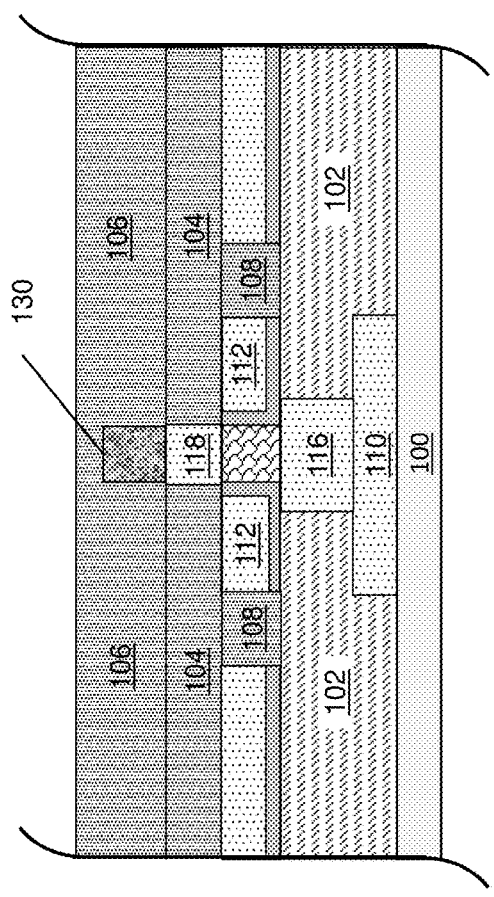
Figure 4P:
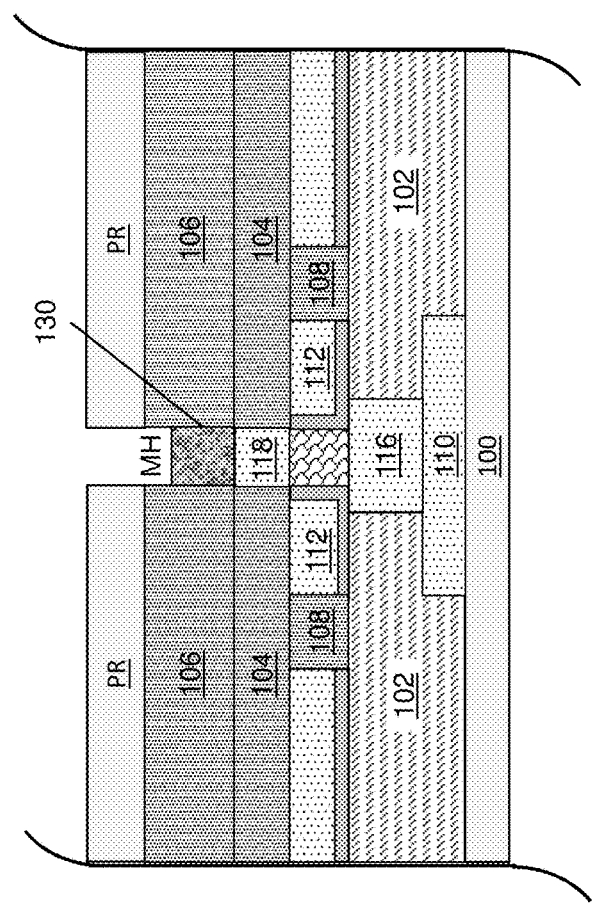
Figure 4Q:
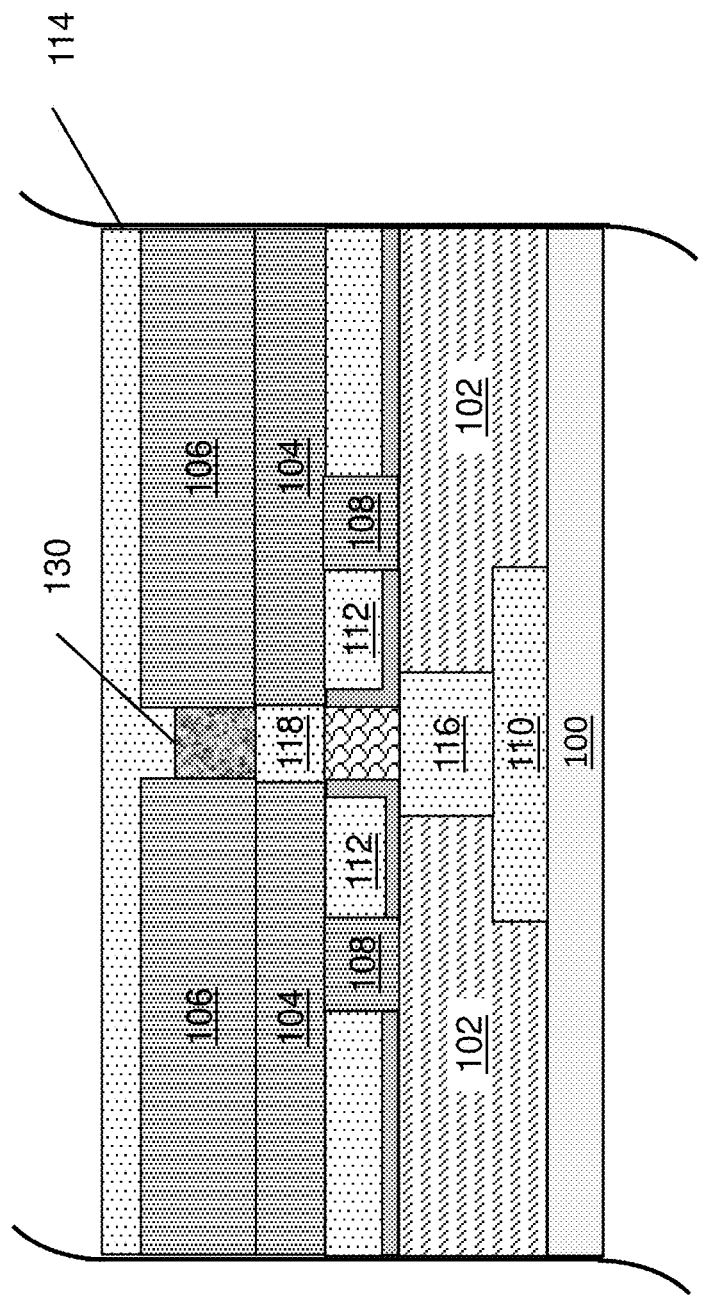

FIGS. 4A-4Q are cross-sectional views illustrating a method of forming the memory device 200 of FIGS. 2A-2C, according to various embodiments of the present disclosure. Referring to FIG. 4A, one or more source lines 110 may be formed on a substrate 100, and a dielectric oxide layer 102 may be formed over the source lines 110. The substrate 100 may be any suitable substrate, such as a semiconductor device substrate.

In particular, a layer of any suitable electrically conductive material as disclosed herein, such as copper, aluminum, zirconium, titanium, tungsten, tantalum, ruthenium, palladium, platinum, cobalt, nickel, alloys thereof, or the like, may be uniformly deposited on the substrate, using any suitable deposition process as disclosed herein, such as physical vapor deposition (PVD), sputtering, chemical vapor deposition (CVD), atomic layer deposition (ALD), plasma-enhanced chemical vapor deposition (PECVD), sputtering, or combinations thereof The electrode material layer may be patterned using any suitable patterning process as disclosed herein, to form the source lines 110, as described above, such as any suitable photolithographic processes and any suitable etching processes, such as wet or dry etching processes.

A dielectric oxide layer 102 may be deposited on the substrate 100, so as to cover the source lines 110. The dielectric oxide layer 102 may be formed using any suitable deposition processes or by using a thermal process oxidation process. In some embodiments, the dielectric oxide layer 102 may include silicon oxide ($SiO_x$).

Referring to FIG. 4B, a photoresist material may be deposited on the dielectric oxide layer 102. The photoresist material may then be patterned to form a photoresist pattern PR. The photoresist pattern PR may expose portions of the source lines 110.

The dielectric oxide layer 102 may then be etched using the photoresist pattern PR as a mask, to form source through holes SH (e.g., via holes) in the oxide layer 102. The etching may include any suitable etching process. The source through holes SH may expose portions of the source lines 110 through the dielectric oxide layer 102.

Referring to FIGS. 4B and 4C, the photoresist pattern PR may be removed by, for example, an ashing or chemical removal process. A layer of electrically conductive material may be deposited on the dielectric oxide layer 102 and in the source through holes SH using any suitable deposition process, to form source electrodes 116 in the source through holes SH. A planarization process, such as a chemical mechanical polishing (CMP) process or the like, may then be performed to remove excess conductive material from the surface of the dielectric oxide layer 102 and to planarize the surfaces of source electrodes 116 and the dielectric oxide layer 102.

Referring to FIG. 4D, a semiconductor material layer 120L may be deposited on the dielectric oxide layer 102 and the source electrode 116, using any suitable deposition process and any suitable semiconductor material, as described herein. In some embodiments, the semiconductor material may preferably be IGZO. A patterned photoresist layer PR may then be formed on the semiconductor material layer 120L, using a photolithographic process.

Referring to FIG. 4E, the semiconductor material layer 120L may be patterned through an etching process, using the photoresist layer PR as a mask, to form channels 120. Any suitable etching process may be used to form the channels 120.

Referring to FIGS. 4E and 4F, the photoresist pattern PR may be removed by an ashing or chemical process. A high-k dielectric layer 122 may be conformally deposited over the patterned channel 120 and the dielectric oxide layer 102. The high-k dielectric layer 122 may be formed by depositing any suitable high-k dielectric material and by using any suitable deposition method, as described herein.

An electrically conductive material layer 112L may be deposited on the high-k dielectric layer 122. The electrically conducive material layer 112L may include any suitable electrically conductive electrode material and may be formed using any suitable deposition process.

Referring to FIG. 4G, a polishing process, such as CMP, may be performed to planarize the electrically conducive material layer 112L, the channels 120, and the high-k dielectric layer 122 such that a co-planar surface may be formed.

Referring to FIG. 4H, photoresist pattern PR may be formed on the electrically conducive material layer 112L, channel 120, and the high-k dielectric layer 122. An etching process may be performed, using the photoresist pattern PR as a mask, to form spacer through holes SpH (e.g., via holes) in the electrically conductive material layer 112L and thereby form a word line 112.

Referring to FIGS. 4H and 4I, the photoresist layer PR may be removed, for example by ashing, and a dielectric material may be deposited on substrate 100, so as to form spacers 108 in the spacer through holes SpH. The dielectric material may include any suitable dielectric material and may be deposited by any suitable deposition method.

A polishing process, such as CMP, may be performed to remove excess dielectric material and form a co-planar surface among the spacers 108, the word lines 112, channels 120, and/or high-k dielectric layer 122.

Referring to FIG. 4J, a first dielectric layer 104 may be deposited on the word lines 112, channels 120, spacers 108, and high-k dielectric layer 122. The first dielectric layer 104 may be formed of any suitable dielectric material and by using any suitable deposition method.

Referring to FIG. 4K, a photoresist pattern PR may be formed on the first dielectric layer 104. The first dielectric layer 104 may then be etched, using the photoresist layer as a mask, to form drain through holes DH (e.g., via holes). The drain through holes DH may expose the channel 120 or at least a portion of the channel 120.

Referring to FIGS. 4K and 4L, the photoresist material may be removed for example, through ashing. Drain electrodes 118 may be formed in the drain through holes DH. For example, any suitable electrically conductive material may be deposited over the first dielectric layer, so as to fill the drain through holes DH. A polishing process, such as a CMP process, may then be performed to remove any excess electrically conductive material and to planarize the drain electrodes 118 and the first dielectric layer 104 to have a co-planar surface.

Referring to FIG. 4M, a memory cell layer 130L may be deposited on the first dielectric layer 104 and the drain electrodes 118. As described above, the memory cell layer 130L may include multiple layers, as described with respect to the memory cells 130A, 130B, 130C, of FIGS. 3A-3B. The memory cell layer 130L may be formed using any suitable deposition process.

Referring to FIGS. 4M and 4N, the memory cell layer 130L may be etched, using the photoresist pattern PR as a mask, to form memory cells 130. The memory cell layer 130L may be etched using any suitable etching process.

Referring to FIGS. 4N and 4O, the photoresist pattern PR may be removed, for example by ashing, and a second dielectric layer 106 may be deposited on the first dielectric layer 104 and the memory cells 130. The second dielectric layer 106 may be formed of the same or of a different dielectric material as first dielectric layer 104.

Referring to FIG. 4P, a photoresist pattern PR may be formed on the second dielectric layer 106. The second dielectric layer 106 may be etched, using the photoresist pattern PR as a mask and any suitable etching process, so as to form a memory cell through holes MH (e.g., via holes) exposing the memory cells 130.

Referring to FIGS. 4P and 4Q, the photoresist pattern PR may be removed and bit lines 114 may be formed on the second dielectric layer 106 and in the memory cell through holes MH. In particular, any suitable electrically conductive material may be deposited over the second dielectric layer 106, using any suitable deposition method. A photoresist pattern may be formed on the deposited electrically conductive material. The electrically conductive material may then be etched through the photoresist pattern, to form the bit lines 114.

Figure 5A:
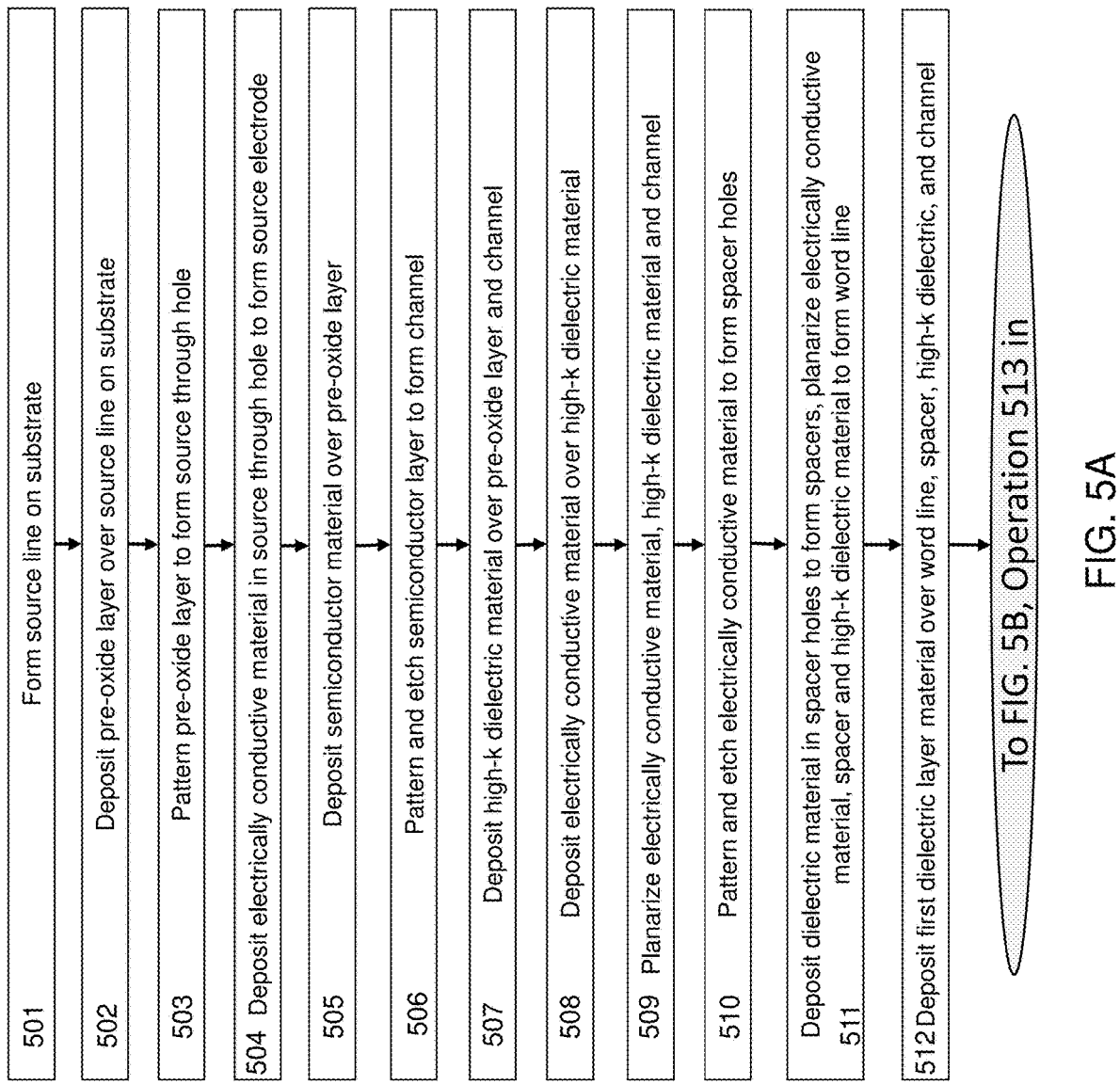
FIGS. 5A and 5B are process flow charts illustrating the various steps of a method of forming a memory device, according to various embodiments of the present disclosure.
Figure 5B:
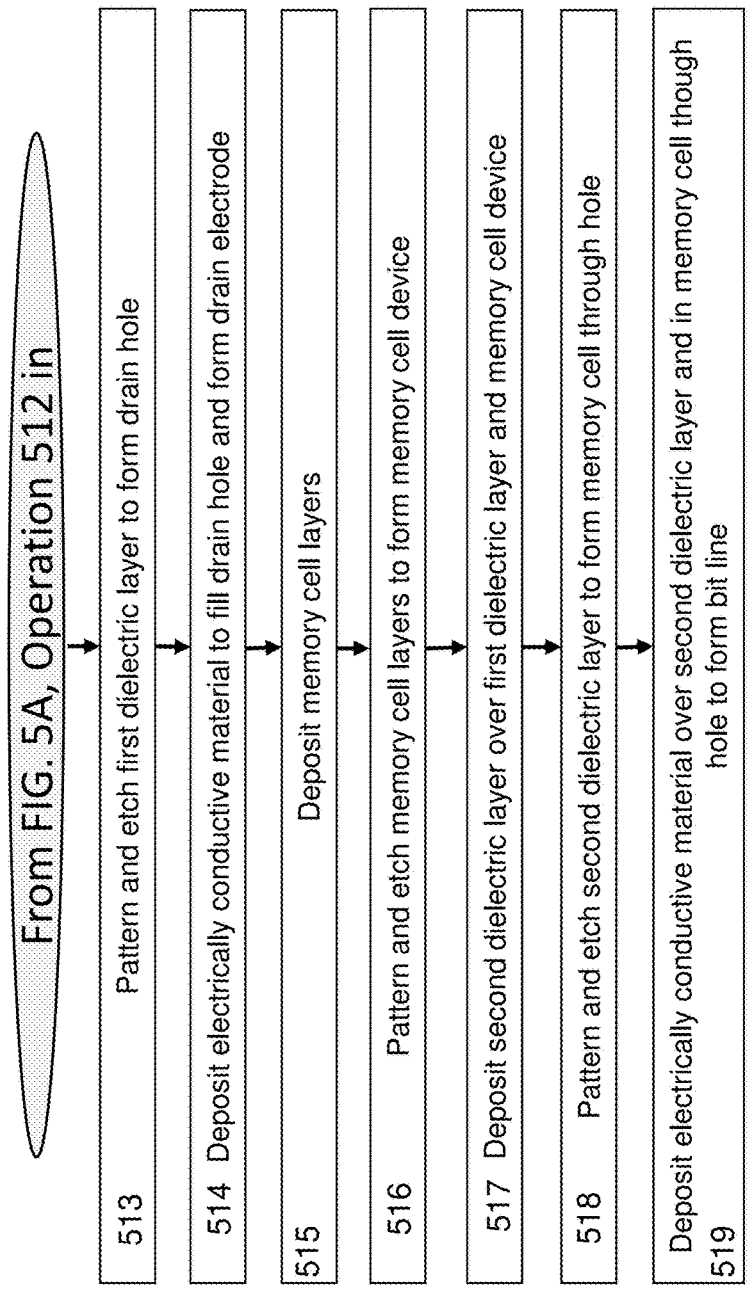

FIGS. 5A and 5B are flow charts illustrating the steps to form a memory structure 202 in accordance with various embodiments of the present disclosure. With reference to FIGS. 4A and 5A, in operation 501, a source line 110 may be formed over a substrate 100. The source line may be formed by depositing a suitable electrically conductive material over the substrate 100. The electrically conductive material may be masked by a photoresist pattern and etch to form the patterned source line 110. With reference to FIGS. 4A, 4B and 5A, in operation 502, a dielectric oxide layer 102 may be deposited over the patterned source line 110 and substrate 100. In operation 503, a photoresist material may be deposited and photolithographically patterned to mask portions of the dielectric oxide layer 102. The dielectric oxide layer 102 may be etched to form a source through holes SH (e.g., via holes) in the oxide layer 102. With reference to FIGS. 4A-4C and 5A, in operation 504 an electrically conductive material may be deposited over the dielectric oxide layer 102 and in source through holes SH to form source electrode 116. With reference to FIGS. 4A-4D and 5A, in operation 505, a semiconductor material 120L may be deposited over the dielectric oxide layer 102 and source electrode 116. With reference to FIGS. 4A-4E and 5A, in operation 506, the semiconductor material 120L may be patterned and etched to form channel 120. With reference to FIGS. 4A-4F and 5A, in operation 507, a high-k dielectric material 122 may be conformally deposited over the dielectric oxide layer 102 and channel 120. In operation 508, an electrically conductive material layer 112L may be deposited on the high-k dielectric layer 122. With reference to FIGS. 4A-4G and 5A, in operation 509, the electrically conductive material 112K, high-k dielectric material 122, and channel 120 may be planarized. With reference to FIGS. 4A-4H and 5A, in operation 510, the electrically conductive material 112L and high-k dielectric material 122 may be patterned and etched to form spacer holes SpH. With reference to FIGS. 4A-4I and 5A, in operation 511, a dielectric material 108 may be deposited to fill spacer holes SpH to form spacers 108. The electrically conductive material 112L and spacer 108 may be planarized to be co-planar with the channel 120 and high-k dielectric material 122 to form word line 112. With reference to FIGS. 4A-4J and 5A, in operation 512, a first dielectric layer 104 may be deposited over word line 112, spacer 108, high-k dielectric 122 and channel 120.

With reference to FIGS. 4A-4K and 5B, in operation 513, the first dielectric layer 104 may be patterned and etched to form drain through hole DH. With reference to FIGS. 4A-4L and 5B, in operation 514, a suitable electrically conductive material may be deposited to fill the drain through hole DH to form drain electrode 118. The drain electrode and first dielectric layer 104 may be planarized. With reference to FIGS. 4A-4M and 5B, in operation 515, a memory cell layer 130L may be deposited over the first dielectric layer 104 and the drain electrodes 118. The memory cell layer 130L may comprise the layers of magnetic junction tunnel (MTJ) memory device, a PCM, a FeRAM, or a ReRAM memory cell device. With reference to FIGS. 4A-4N and 5B, in operation 516, the memory cell layer 130L may be patterned and etched to form memory cell device 130. With reference to FIGS. 4A-4O and 5B, in operation 517, a second dielectric layer material 106 may be deposited over the first dielectric material layer 104 and memory cell device 130. With reference to FIGS. 4A-4P and 5B, in operation 518, the second dielectric layer 106 may be patterned and etched to form a memory cell through holes MH (e.g., via holes) exposing the memory cells 130. With reference to FIGS. 4A-4Q and 5B, in operation 519, an electrically conductive metallic layer may be deposited over the second dielectric layer 106 and in the memory cell through holes MH to form bit line 114.

Various embodiments provide a memory structure 202 comprising: a surrounding gate thin film transistor (TFT) 124 and a memory cell 130 stacked on the surrounding gate TFT 124. The surrounding gate TFT 124 includes: a channel comprising a semiconductor material; a source electrode electrically connected to a first end of the channel; a drain electrode 118 electrically connected to an opposing second end of the channel 120; a high-k dielectric layer 122 surrounding the channel; and a gate electrode 112 surrounding the high-k dielectric layer 122. The memory cell 130 includes a bottom electrode 132 that is electrically connected to the drain electrode 118, and a top electrode 134 that is electrically connected to the bit line 114.

Various embodiments provide a memory device comprising: a substrate 100, source lines 110 disposed on the substrate 100; word lines 112 disposed over the source lines 110; bit lines 114 disposed over the word lines 112; and memory structures 202 disposed between the source lines 110 and the bit lines 114. The memory structures 202 each comprise a gate-all-around (GAA) transistor 124 and a memory cell 130 disposed on the GAA transistor 124. The GAA transistor 124 comprises a source electrode 116 electrically coupled to one of the source lines 110; a drain electrode 118; a channel 120 electrically coupled to the source and drain electrodes 116, 118, the channel 120 comprising a metal oxide semiconductor material; and a gate electrode comprising a portion of one of the word lines. The memory cell 130 comprises: a first electrode 132 electrically coupled to the drain electrode 118 of the GAA transistor 124; and a second electrode 134 electrically coupled to one of the bit lines 114.

Various embodiments provide method of forming a memory device 200, the method comprising: forming a source line 110 on a substrate 100; depositing a dielectric oxide layer 102 over the source line 110; patterning the dielectric oxide layer 102 to form a source through hole SH that expose portions of the source line 110; depositing a first electrically conductive material in source through hole SH to form a source electrode 116; depositing a semiconductor material over the dielectric oxide layer 102; patterning the semiconductor material to form a channel 120; depositing high-k dielectric material 122 over the dielectric oxide layer 102 and the channel 120; depositing a second electrically conductive material over the high-k dielectric material 122; planarizing the second electrically conductive material, high-k dielectric material 122 and the channel 120; patterning the second electrically conductive material to form spacer holes SpH; depositing a spacer dielectric material in the spacer holes to form a spacer 108; planarizing the second electrically conductive material, the spacer 108, the high-k dielectric material 122 to form a word line 112; depositing a first dielectric material 104 over the word line 112, spacer 108, high-k dielectric 122, and the channel 120; patterning the first dielectric material 104 to form a drain through hole DH; depositing a third electrically conductive material to fill the drain through hole DH to form a drain electrode 118; depositing memory cell layers; patterning the memory cell layers to form a memory cell device 130; depositing a second dielectric material 106 over the first dielectric material 104 and the memory cell device 130; patterning the second dielectric material 106 to form a memory cell through hole MCH; and depositing a fourth electrically conductive material over the second dielectric material 106 and in the memory cell though hole MCH to form a bit line 114.

According to various embodiments, an IGZO TFT with a GAA design may be provided to form a vertical selector transistor to switch a memory cell device. The various embodiment may further provide cross bar bit line and source lines and word line gate control to more precisely drive one memory cell device 130. The various embodiments that include a TFT with GAA design may improve channel transport and gain more current. Such embodiments may provide a high on/off property that makes memory cell read/write operation faster. Moreover, the various embodiments disclosed herein provide a higher memory cell density than prior memory configurations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory structure comprising:
a channel comprising a semiconductor material;
a source electrode connecting a first end of the channel and a source line;
a drain electrode electrically connected to an opposing second end of the channel;
a high-k dielectric layer surrounding the channel;
a gate electrode surrounding the high-k dielectric layer; and
a memory cell connected to the drain electrode and a bit line, the memory cell comprising a first electrode and a second electrode that is connected to the bit line.

2. The memory structure of claim 1, wherein the high-k dielectric layer and the channel are disposed within a through hole formed in the gate electrode.

3. The memory structure of claim 1, wherein the channel and the memory cell are column-shaped and are vertically stacked on a substrate, such that long axes of the channel and the memory cell are perpendicular to a plane of the substrate.

4. The memory structure of claim 1, wherein:
the first electrode of the memory cell is connected to the drain electrode; and
the gate electrode comprises a portion of a word line.

5. The memory structure of claim 1, wherein the memory cell comprises a magneto-resistive random-access memory (MRAM) cell.

6. The memory structure of claim 1, wherein the memory cell comprises a magnetic tunnel junction (MTJ) disposed between the first electrode and the second electrode.

7. The memory structure of claim 1, wherein the channel comprises indium gallium zinc oxide (IGZO).

8. A memory device comprising:
source lines disposed on the substrate;
word lines disposed over the source lines;
bit lines disposed over the word lines;
channels that comprise a semiconductor material and that extend through the word lines;
memory cells disposed over the channels;
source electrodes that electrically couple the channels to the source lines; and
drain electrodes that electrically couple the channels to the bit lines,
wherein portions of the word lines that surround the channels operate as gate electrodes that control current flow through the channels.

9. The memory device of claim 8, further comprising surrounding gate insulator (SGI) layers disposed between the channels and the word lines.

10. The memory device of claim 9, wherein the channels are disposed in through holes formed in the word lines.

11. The memory device of claim 9, further comprising:
a substrate;
a dielectric oxide layer disposed on the substrate; and
a high-k dielectric layer disposed between the dielectric oxide layer and the word lines, wherein,
the SGI layers comprise portions of the high-k dielectric layer, and
the source electrodes are disposed within the dielectric oxide layer.

12. The memory device of claim 8, further comprising dielectric spacers disposed between adjacent word lines.

13. The memory device of claim 8, further comprising a first dielectric layer disposed on the word lines and comprising through holes in which the drain electrodes are disposed.

14. The memory device of claim 13, further comprising a second dielectric layer disposed on the first dielectric layer and comprising through holes in which the memory cells are disposed.

15. The memory device of claim 8, wherein the memory cells comprise magneto-resistive random-access memory (MRAM) cells.

16. The memory device of claim 8, wherein the memory cells each comprise a magnetic tunnel junction (MTJ) disposed between a first electrode and a second electrode of the memory cell.

17. The memory device of claim 8, wherein the channel comprises indium gallium zinc oxide (IGZO).

18. A memory device comprising:
a source line;
a word line disposed over the source line;
a bit line disposed over the word line;
a channel extending through the word line and comprising a semiconductor material;
a surrounding gate insulating (SGI) layer separating the channel and the word line;
a memory cell disposed between the channel and the bit line;
a drain electrode electrically connecting the channel to the memory cell; and
a source electrode electrically connecting the source line and the channel,
wherein a portion of the word line operates as a gate electrode that controls current flow through the channel.

19. The memory device of claim 18, wherein:
a first electrode of the memory cell is electrically connected to the bit line;
a second electrode of the memory cell is electrically connected to the source electrode; and
the channel and the SGI layer are disposed in a through hole formed in the word line.

20. The memory device of claim 18, wherein the semiconductor material comprises indium gallium zinc oxide (IGZO).

* * * * *